United States Patent
Harada et al.

(10) Patent No.: US 7,276,623 B2
(45) Date of Patent: Oct. 2, 2007

(54) POLYMERIZABLE ESTER COMPOUNDS

(75) Inventors: Yuji Harada, Joetsu (JP); Jun Hatakeyama, Joetsu (JP); Yoshio Kawai, Joetsu (JP); Kazuhiko Maeda, Tokyo (JP); Haruhiko Komoriya, Kawagoe (JP); Michitaka Ootani, Kawagoe (JP)

(73) Assignees: Shin-Etsu Chemical Co., Ltd., Tokyo (JP); Central Glass Co., Ltd., Ube-shi (JP)

( * ) Notice: Subject to any disclaimer, the term of this patent is extended or adjusted under 35 U.S.C. 154(b) by 0 days.

(21) Appl. No.: 11/440,107

(22) Filed: May 25, 2006

(65) Prior Publication Data
US 2006/0269870 A1 Nov. 30, 2006

(30) Foreign Application Priority Data
May 27, 2005 (JP) ............................. 2005/155292

(51) Int. Cl.
C07C 69/00 (2006.01)
G03C 1/00 (2006.01)

(52) U.S. Cl. .................................. 560/129; 430/270.1
(58) Field of Classification Search ...................... None
See application file for complete search history.

(56) References Cited

U.S. PATENT DOCUMENTS

| 4,491,628 | A | 1/1985 | Ito et al. |
| 5,310,619 | A | 5/1994 | Crivello et al. |
| 6,200,725 | B1 | 3/2001 | Takechi et al. |
| 6,280,898 | B1 | 8/2001 | Hasegawa et al. |
| 2001/0026901 | A1 | 10/2001 | Maeda et al. |

FOREIGN PATENT DOCUMENTS

| JP | 63-27829 A | 2/1988 |
| JP | 2-27660 B2 | 6/1990 |
| JP | 9-73173 A | 3/1997 |
| JP | 9-90637 A | 4/1997 |
| JP | 9-230595 A | 9/1997 |
| JP | 10-10739 A | 1/1998 |
| JP | 2000-26446 A | 1/2000 |
| JP | 2000-159758 A | 6/2000 |
| WO | WO-97/33198 A1 | 9/1997 |

OTHER PUBLICATIONS

Shinji Kishimura et al., Resist interaction in 193-/157-nm immersion lithography, Advances in Resist Technology and Processing XXI, Proceedings of SPIE, (2004), pp. 44-45, vol. 5376, Bellingham, WA.

Soichi Owa et al., Immersion lithography: its potential performance and issues, Optical Microlithography XVI, Proceedings of the SPIE, (2003), pp. 724-725, vol. 5040.

Tsukasa Azuma et al., Line edge roughness of chemically amplified resists, Advances in Resist Technology and Processing XVII, Proceedings of SPIE, (2000), pp. 264-265, vol. 3999.

Jun Hatakeyama et al., Newly developed alternating-copolymer-based silicon containing resists for sub-100nm pattern fabrication, Advances in Resist Technology and Processing XX, Proceedings of SPIE, (2003), pp. 672-673. vol. 5039.

Hiroshi Ito et al., Polymer design for 157 nm chemically amplified resists, Advances in Resist Technology and Processing XVIII, Proceedings of SPIE, (2001), p. 273, vol. 4345.

*Primary Examiner*—Johann Richter
*Assistant Examiner*—MLouisa Lao
(74) *Attorney, Agent, or Firm*—Birch, Stewart, Kolasch & Birch, LLP

(57) ABSTRACT

Ester compounds having formula (1) wherein $R^1$ is fluorine or $C_1$-$C_{10}$ fluoroalkyl, $R^2$ is $C_1$-$C_{10}$ alkylene or fluoroalkylene, and $R^3$ is an acid labile group are novel. They can be polymerized into polymers which are used to formulate resist compositions, which are processed by the lithography involving ArF exposure, offering many advantages including improved resolution and transparency, minimal line edge roughness, improved etch resistance, and especially minimal surface roughness after etching.

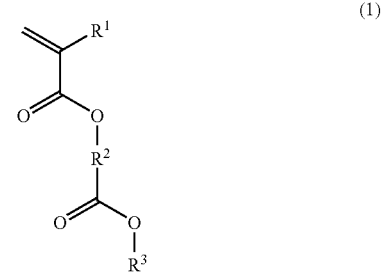

(1)

3 Claims, No Drawings

US 7,276,623 B2

POLYMERIZABLE ESTER COMPOUNDS

CROSS-REFERENCE TO RELATED APPLICATION

This non-provisional application claims priority under 35 U.S.C. §119(a) on Patent Application No. 2005-155292 filed in Japan on May 27, 2005, the entire contents of which are hereby incorporated by reference.

TECHNICAL FIELD

This invention relates to polymerizable ester compounds which are useful as monomers to form base polymers for use in resist compositions, especially chemically amplified resist compositions for the lithographic micropatterning technology.

BACKGROUND ART

In the recent drive for higher integration and operating speeds in LSI devices, the pattern rule is made drastically finer. The rapid advance toward finer pattern rules is grounded on the development of a light source of a shorter wavelength, a projection lens with an increased numerical aperture (NA), and a resist material with improved performance.

With respect to the light source for exposure, the changeover from i-line (365 nm) to shorter wavelength KrF laser (248 nm) enabled mass-scale production of DRAM with an integration degree of 64 MB (processing feature size $\leq 0.25$ µm). To establish the micropatterning technology (processing feature size $\leq 0.2$ µm) necessary for the fabrication of DRAM with an integration degree of 256 MB and 1 GB or more, the lithography using ArF excimer laser (193 nm) is under active investigation. Although $F_2$ laser (157 nm) is also considered as one candidate light source of shorter wavelength, the use of $F_2$ laser is postponed because of many outstanding problems including a more expensive scanner.

With respect to the increase of NA, not only an improvement in lens performance is sought for, but also the immersion lithography which can establish an NA of 1.00 or greater by filling a high refractive index liquid between a lens and a wafer is of great interest. See Proc. SPIE, Vol. 5376, p44 (2004), for example. For the ArF immersion lithography now under investigation, it was proposed to apply to the 45-nm node by filling the space between the lens and the wafer with deionized water having a refractive index of 1.44. See Proc. SPIE, Vol. 5040, p724 (2003), for example.

With respect to the resist material, since the development of acid-catalyzed chemical amplification positive working resist materials as disclosed in USP 4,491,628 and USP 5,310,619 (JP-B 2-27660 and JP-A 63-27829), it has become possible to achieve a higher resolution and sensitivity. They now become predominant resist materials adapted for deep UV lithography. Of these, the KrF resist materials enjoyed early use on the 0.3 micron process, passed through the 0.25 micron rule, and currently entered the mass production phase on the 0.18 micron rule. Engineers have started investigation on the 0.15 micron rule. The ArF resist is expected to enable miniaturization of the design rule to 0.13 µm or less.

Various alkali-soluble resins are used as the base resin in such chemically amplified resist compositions. Depending on a light source selected for light exposure, a base resin of different skeleton is used. For KrF resists, a polyhydroxystyrene resin having phenolic hydroxyl groups as the alkali-soluble group is now a standard base resin.

For ArF resist materials, since polyhydroxystyrene resins and novolac resins have very strong absorption at a wavelength around 193 nm, studies were made on poly(meth)acrylate resins and resins comprising cycloaliphatic olefin such as norbornene as polymerized units, both using carboxyl groups as the alkali-soluble group (see JP-A 9-73173, JP-A 10-10739, JP-A 9-230595 and WO 97/33198). Of these, the poly(meth)acrylate resins are expected to reach a practical level because of ease of polymerization. One of the poly(meth)acrylate resins proposed thus far is a poly(meth)acrylate resin having methyladamantyl groups as the acid labile group and lactone rings as the adhesive group as disclosed in JP-A 9-90637. Norbornyl lactone is also proposed as an adhesive group having enhanced etching resistance as disclosed in JP-A 2000-26446 and JP-A 2000-159758.

The serious problems left unsolved for ArF resist materials are reduction of line edge roughness and enhancement of etching resistance. In general, a higher light contrast leads to a less line edge roughness. For example, increased NA of lens, application of modified illumination or phase shift mask, or wavelength reduction allows the light contrast to be increased, resulting in a reduced line edge roughness. Thus the wavelength reduction from KrF to ArF excimer laser is expected to reduce line edge roughness. However, it is reported that ArF resists actually have greater line edge roughness than KrF resists and that image contrast is in inverse proportion to line edge roughness. This is attributable to the difference in performance between ArF and KrF resists. See Proc. SPIE, Vol. 3999, p264 (2000), for example.

The use of an alternating copolymer as the base is proposed as one means of minimizing the edge roughness of pattern after development. See Proc. SPIE, Vol. 5039, p672 (2003), for example. The alternating copolymer having an ordered arrangement of recurring units within the polymer chain is characterized by its ability to minimize edge roughness, as compared with random copolymers and block copolymers.

One candidate of alternating copolymers that can be used as the ArF resist is a copolymer of norbornene and maleic anhydride as described in JP-A 10-10739. However, the resist using this copolymer suffers from storage instability and the like, and it remains unexpectable when this resist will be reduced to commercial practice. Another candidate is a copolymer of norbornene and α-trifluoromethylacrylate, which was the base polymer candidate for $F_2$ resist. See Proc. SPIE, Vol. 4345, p273 (2001), for example.

SUMMARY OF THE INVENTION

An object of the invention is to provide polymerizable ester compounds which are useful as monomers to form base polymers for use in resist compositions, especially chemically amplified resist compositions, having a high transmittance to laser light with a wavelength of up to 300 nm, especially up to 200 nm.

The inventors have found that a polymerizable ester compound having an acid-eliminatable unit incorporated at a position remote from a polymerizable functional group is a raw material from which a polymer exhibiting satisfactory alkali development performance is formed.

According to the invention, there is provided an ester compound having the general formula (1).

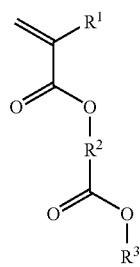
(1)

Herein $R^1$ is a fluorine atom or a straight, branched or cyclic fluorinated alkyl group of 1 to 10 carbon atoms, $R^2$ is a straight, branched or cyclic alkylene or fluorinated alkylene group of 1 to 10 carbon atoms, and $R^3$ is an acid labile group.

The preferred ester compound has the general formula (1a).

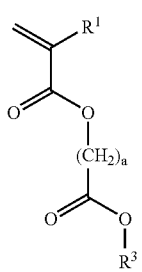
(1a)

In formula (1a), $R^1$ and $R^3$ are as defined above, and "a" is an integer of 1 to 6. More preferably, $R^1$ is trifluoromethyl and "a" is equal to 1.

BENEFITS OF THE INVENTION

The ester compound of the invention can be polymerized into a polymer which is used to formulate a resist composition. The resist composition, when processed by the lithography involving ArF exposure, has many advantages including improved resolution and transparency, minimal line edge roughness, improved etch resistance, and especially minimal surface roughness after etching. It exhibits similar better performance when processed by the ArF immersion lithography with liquid interposed between the projection lens and the wafer.

DESCRIPTION OF THE PREFERRED EMBODIMENTS

As used herein, the notation $(C_n\text{-}C_m)$ means a group containing from n to m carbon atoms per group.

The polymerizable ester compounds of the invention have the general formula (1) or (1a).

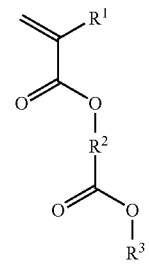
(1)

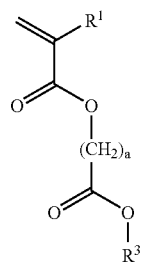
(1a)

Herein $R^1$ is a fluorine atom or a straight, branched or cyclic fluorinated alkyl group of 1 to 10 carbon atoms, $R^2$ is a straight, branched or cyclic alkylene or fluorinated alkylene group of 1 to 10 carbon atoms, $R^3$ is an acid labile group, and "a" is an integer of 1 to 6.

Examples of the fluorinated $C_1\text{-}C_{10}$ alkyl groups represented by $R^1$ include substituted forms of alkyl groups such as methyl, ethyl, n-propyl, isopropyl, n-butyl, sec-butyl and tert-butyl in which some or all of the hydrogen atoms are substituted by fluorine atoms, for example, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

Examples of the straight, branched or cyclic $C_1\text{-}C_{10}$ alkylene groups represented by $R^2$ include alkyl groups such as methyl, ethyl, n-propyl, isopropyl, n-butyl, sec-butyl and tert-butyl, with one hydrogen atom being eliminated. Suitable fluoroalkylene groups include substituted forms of the foregoing alkylene groups in which some or all of the hydrogen atoms are substituted by fluorine atoms.

$R^3$ is an acid labile group which is selected from a variety of such groups. Examples of the acid labile group include groups of the following general formulae (AL-1) to (AL-3), trialkylsilyl groups in which each alkyl moiety has 1 to 6 carbon atoms, and oxoalkyl groups of 4 to 20 carbon atoms.

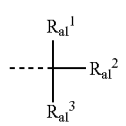
(AL-1)

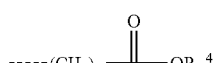
(AL-2)

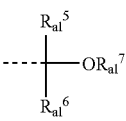
(AL-3)

In these formulae and throughout the specification, a broken line denotes a valence bond.

$R_{a1}^1$, $R_{a1}^2$ and $R_{a1}^3$ may be the same or different and stand for straight, branched or cyclic $C_1$-$C_{20}$ hydrocarbon groups, typically alkyl groups, which may contain one or more hetero atom such as oxygen, sulfur or nitrogen, or bridged cyclic hydrocarbon groups. Alternatively, a pair of $R_{a1}^1$ and $R_{a1}^2$, $R_{a1}^1$ and $R_{a1}^3$, and $R_{a1}^2$ and $R_{a1}^3$, taken together, may form a ring with the carbon atom to which they are bonded. Each of $R_{a1}^1$, $R_{a1}^2$ and $R_{a1}^3$ is a straight or branched $C_1$-$C_{20}$ alkylene group when they form a ring. $R_{a1}^4$ and $R_{a1}^7$ stand for straight, branched or cyclic $C_1$-$C_{20}$ alkyl groups, which may contain one or more hetero atom such as oxygen, sulfur, nitrogen or fluorine, such as alkyl groups in which some hydrogen atoms are replaced by hydroxyl, alkoxy, oxo, amino, alkylamino or other groups. $R_{a1}^5$ and $R_{a1}^6$ stand for hydrogen or straight, branched or cyclic $C_1$-$C_{20}$ alkyl groups, which may contain one or more hetero atom such as oxygen, sulfur, nitrogen or fluorine. Alternatively, a pair of $R_{a1}^5$ and $R_{a1}^6$, $R_{a1}^5$ and $R_{a1}^7$, and $R_{a1}^6$ and $R_{a1}^7$, taken together, may form a ring with the carbon or carbon and oxygen atoms to which they are bonded. Each of $R_{a1}^5$, $R_{a1}^6$ and $R_{a1}7$ is a straight or branched $C_1$-$C_{20}$ alkylene group when they form a ring. The subscript α is an integer of 0 to 6.

In formula (AL-1), illustrative examples of $R_{a1}^1$, $R_{a1}^2$ and $R_{a1}^3$ include methyl, ethyl, n-propyl, isopropyl, tert-butyl, cyclohexyl, cyclopentyl, norbornyl, adamantyl, and menthyl. The acid labile groups of formula (AL-1) are exemplified by the substituent groups shown below.

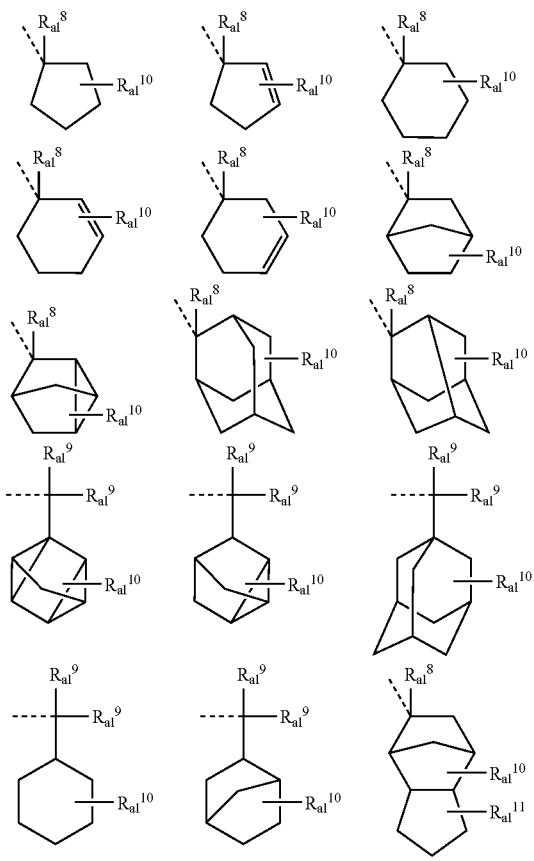

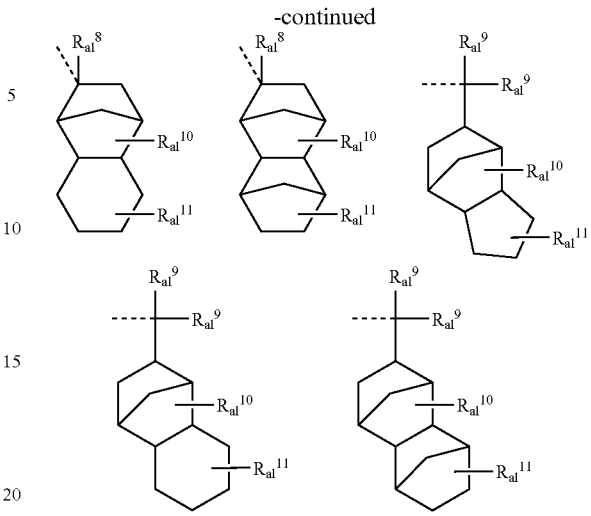

Herein, $R_{a1}^8$ and $R_{a1}^9$ stand for straight, branched or cyclic alkyl groups of 1 to 10 carbon atoms, preferably 1 to 6 carbon atoms. $R_{a1}^{10}$ and $R_{a1}^{11}$ stand for hydrogen or monovalent hydrocarbon groups of 1 to 6 carbon atoms, typically alkyl groups, which may contain a hetero atom and which may be straight, branched or cyclic.

Illustrative examples of $R_{a1}^8$ and $R_{a1}^9$ include methyl, ethyl, propyl, isopropyl, n-butyl, sec-butyl, n-pentyl, n-hexyl, cyclopropyl, cyclopropylmethyl, cyclobutyl, cyclopentyl, and cyclohexyl. Illustrative examples of $R_{a1}^{10}$ and $R_{a1}^{11}$ include methyl, ethyl, n-propyl, isopropyl, n-butyl, sec-butyl, n-pentyl, n-hexyl, hydroxymethyl, hydroxyethyl, methoxy, methoxymethyl, ethoxy, and tert-butoxy. When $R^{a110}$ and $R_{a1}^{11}$ contain hetero atoms such as oxygen, sulfur or nitrogen, they may be contained, for example, in the form of —OH, —$OR_{a1}^{12}$, —O—, —S—, —S(=O)—, —$NH_2$, —$NHR_{a1}^{12}$, —$N(R_{a1}^{12})_2$, or —$NR_{a1}^{12}$— wherein $R_{a1}^{12}$ is a $C_1$-$C_5$ alkyl group. Optionally, a hetero atom may intervene in the alkyl chain.

Illustrative examples of the acid labile groups of formula (AL-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (AL-3), examples of the straight, branched or cyclic $C_1$-$C_{20}$ alkyl groups represented by $R_{a1}^5$ and $Ra_{a1}^6$ include methyl, ethyl, propyl, isopropyl, n-butyl, sec-butyl, tert-butyl, cyclopentyl, cyclohexyl, 2-ethylhexyl, and n-octyl. Examples of suitable hydrocarbon groups represented by $R_{a1}^7$ include substituted alkyl groups as shown below.

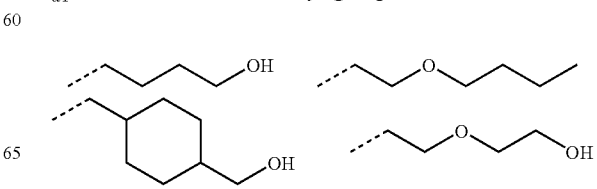

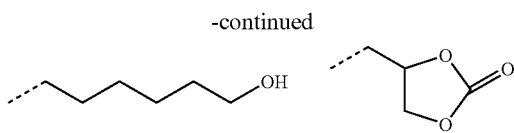

Of the acid labile groups having formula (AL-3), examples of the cyclic groups include tetrahydrofuran-2-yl, 2-methyltetrahydrofuran-2-yl, tetrahydropyran-2-yl, and 2-methyltetrahydropyran-2-yl. Examples of the straight and branched groups are exemplified by the following groups, with ethoxyethyl, butoxyethyl and ethoxypropyl being preferred.

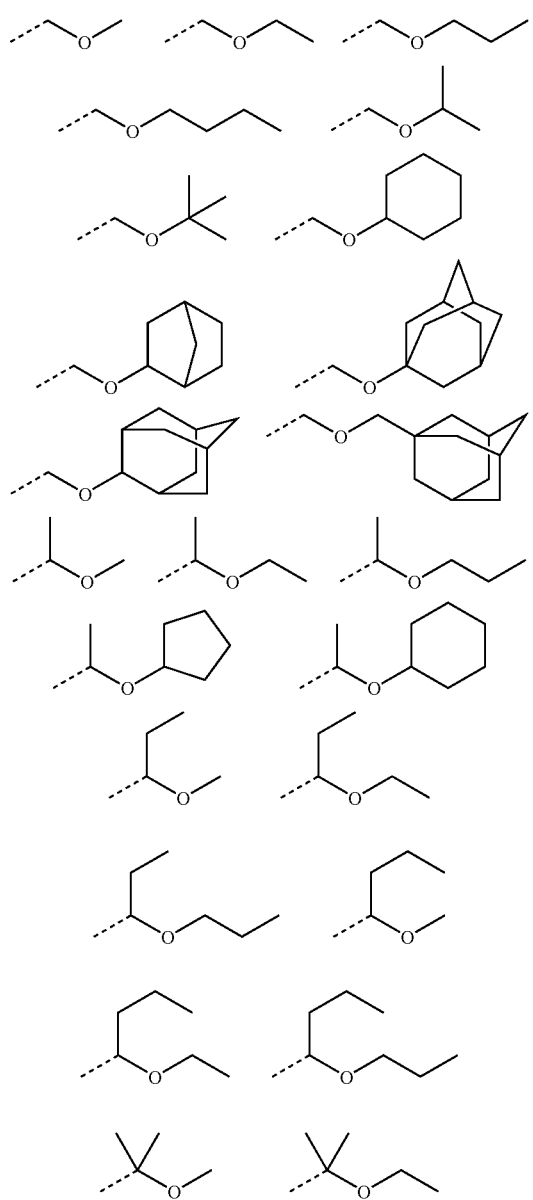

The polymerizable ester compound of the invention can be prepared, for example, by the following method, but the invention is not limited thereto.

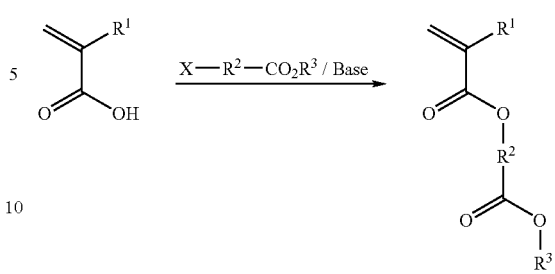

Herein, $R^1$ is a fluorine atom or a straight, branched or cyclic $C_1$-$C_{10}$ fluoroalkyl group, $R^2$ is a straight, branched or cyclic $C_1$-$C_{10}$ alkylene or fluoroalkylene group, $R^3$ is an acid labile group, and X is a chlorine, bromine or iodine atom.

In this exemplary reaction scheme, a fluorinated acrylic acid is reacted with X—$R^2$—$CO_2R^3$ in the presence of a base. Examples of the acrylic acid used herein include α-fluoroacrylic acid and α-trifluoromethylacrylic acid. The amount of the base used, which depends on its structure, is usually in the range of 1 to 10 moles, preferably 1 to 3 moles per mole of the fluorinated acrylic acid. Examples of the base used herein include potassium carbonate, sodium carbonate, sodium hydride, sodium methoxide, sodium ethoxide, potassium t-butoxide, triethylamine, 4-dimethylaminopyridine and the like. Examples of suitable solvents which can be used as the reaction medium include hydrocarbons such as hexane, heptane, benzene, toluene, xylene and cumene; ethers such as diethyl ether, dibutyl ether, diethylene glycol diethyl ether, diethylene glycol dimethyl ether, tetrahydrofuran, and 1,4-dioxane; and N,N-dimethylformamide (abbreviated as DMF), which may be used alone or in admixture. An appropriate reaction temperature may be selected depending on other reaction conditions, although the reaction is generally performed at room temperature or under ice cooling. It is desired for higher yields that the reaction time is determined by monitoring the progress of reaction by thin-layer chromatography (TLC) or gas chromatography (GC). The reaction time is usually about 0.1 hour to about 240 hours. After the completion of reaction, the target ester compound (1) or (1a) is recovered from the reaction mixture by a conventional post-treatment such as aqueous work-up or concentration. If necessary, the ester compound (1) or (1a) can be purified by any conventional technique such as recrystallization, chromatography or distillation.

Illustrative, non-limiting examples of the monomers having formula (1) and (1a) are given below.

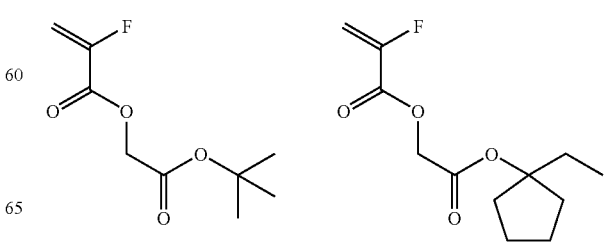

-continued
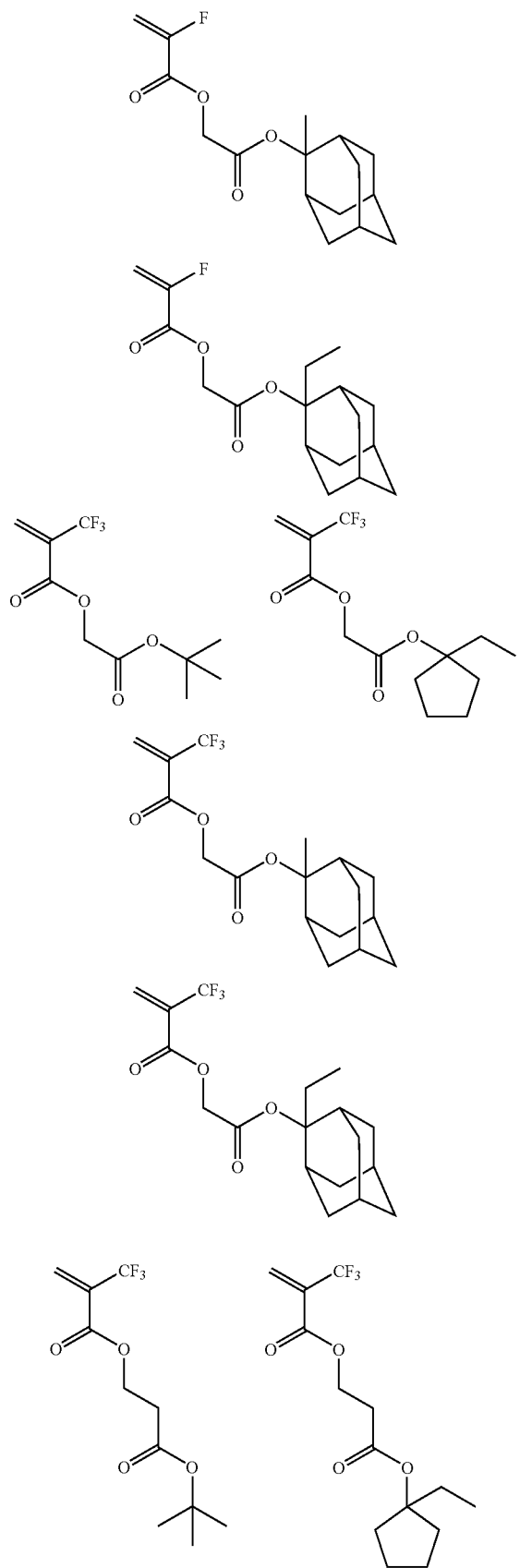
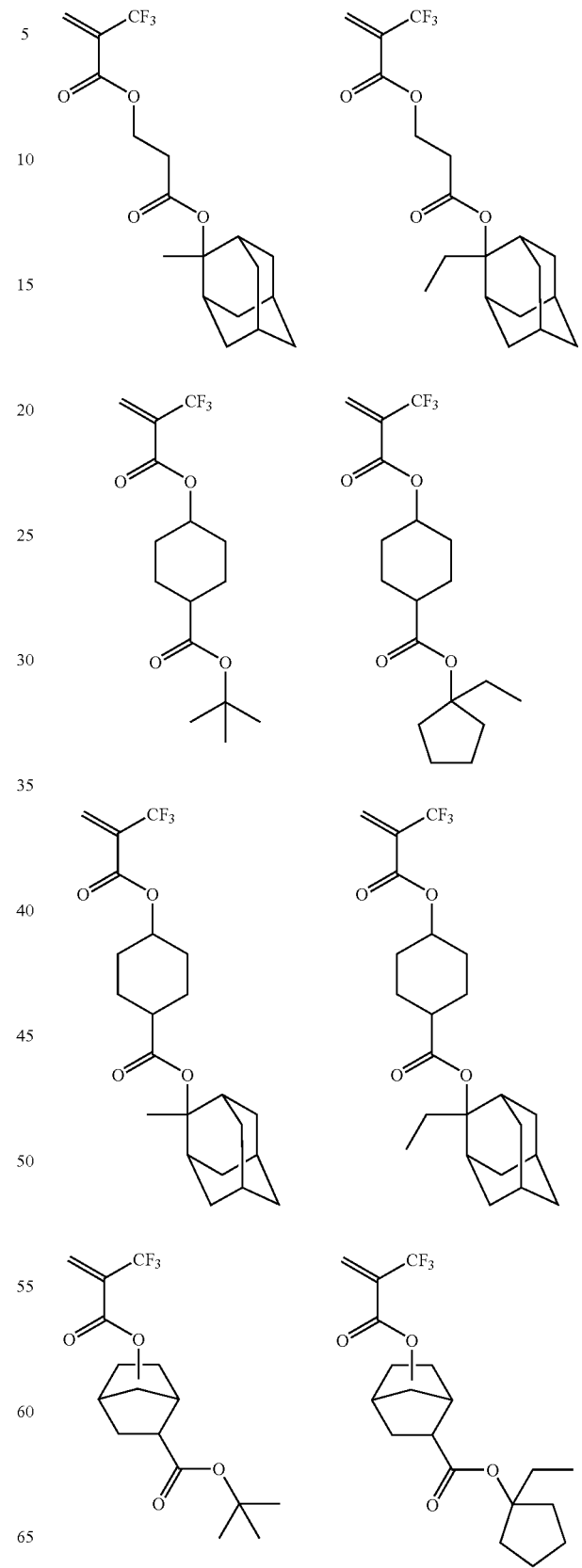

-continued

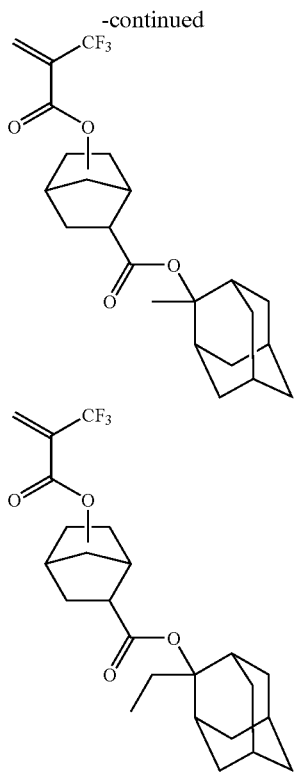

EXAMPLE

Examples of the invention are given below by way of illustration and not by way of limitation.

Synthesis Example 1

Synthesis of Monomer 1

In a nitrogen stream, a 1-L flask was charged with 23.1 g of a-trifluoromethylacrylic acid, 30.0 g of 1-ethylcyclopentyl chloroacetate, 27.4 g of potassium carbonate, and 100 g of DMF. Reaction occurred at room temperature for 8 hours. Water, 400 g, was added to the reaction system, from which an organic matter was extracted with 400 g of hexane. The organic layer was washed with a saturated potassium carbonate aqueous solution and saturated saline water. The organic layer was dried over sodium sulfate, and concentrated under reduced pressure in an evaporator. The remaining oily matter was purified by vacuum distillation (b.p. 76° C./0.2 mmHg), collecting 33.4 g of Monomer 1. The yield was 69.4%.

FT-IR (NaCl): ν=2971, 2881, 1743, 1461, 1427, 1407, 1382, 1363, 1346, 1321, 1278, 1220, 1176, 1151, 1106, 995, 950, 811 cm$^{-1}$ $^1$H-NMR (300.5 MHz in DMSO-d6): δ=0.88 (t, J=7.4 Hz, 3H), 1.53-1.78 (m, 6H), 2.00 (q, J=7.4 Hz, 2H), 2.09-2.14 (m, 2H), 4.68 (s, 2H), 6.52 (q, J=1.2 Hz, 1H), 6.82 (q, J=1.8 Hz, 1H) ppm $^{13}$C-NMR (75.6 MHz in DMSO-d6): δ=8.7, 23.9, 29.8, 37.1, 61.8, 96.2, 130.9, 133.7, 160.7, 165.9 ppm $^{19}$F-NMR (282.8 MHz in DMSO-d6): δ=-66.6 (total: 3F) ppm

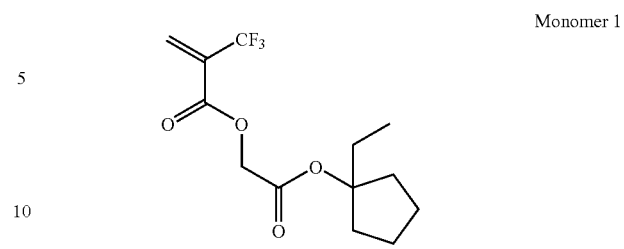

Monomer 1

Japanese Patent Application No. 2005-155292 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An ester compound having the general formula (1):

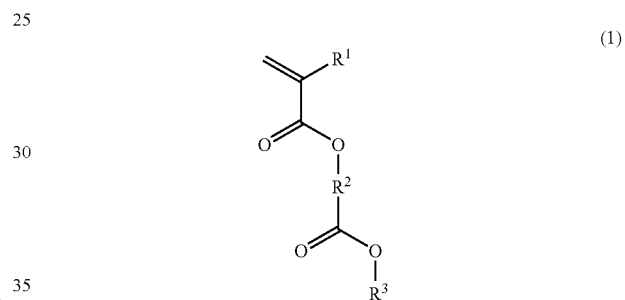

wherein $R^1$ is a fluorine atom or a straight, branched or cyclic fluorinated alkyl group of 1 to 10 carbon atoms, $R^2$ is a straight, branched or cyclic alkylene or fluorinated alkylene group of 1 to 10 carbon atoms, and $R^3$ is an acid labile group.

2. The ester compound of claim 1 having the general formula (1a):

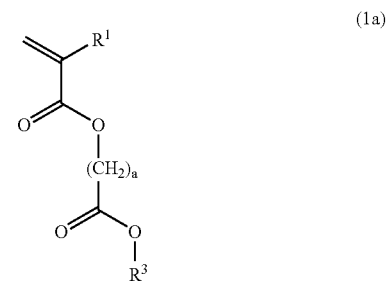

wherein $R^1$ is a fluorine atom or a straight, branched or cyclic fluorinated alkyl group of 1 to 10 carbon atoms, $R^3$ is an acid labile group, and a is an integer of 1 to 6.

3. The ester compound of claim 2 wherein in formula (1a), $R^1$ is trifluoromethyl and a is 1.

* * * * *